(12) United States Patent
Tsai et al.

(10) Patent No.: US 7,795,077 B2
(45) Date of Patent: Sep. 14, 2010

(54) MEMORY CARD AND METHOD FOR FABRICATING THE SAME

(75) Inventors: Ming-Sung Tsai, Hsinchu (TW); Hsieh-Wei Hsu, Hsinchu (TW)

(73) Assignee: UTAC (Taiwan) Corporation, Hsinchu (TW)

( * ) Notice: Subject to any disclaimer, the term of this patent is extended or adjusted under 35 U.S.C. 154(b) by 427 days.

(21) Appl. No.: 11/981,216

(22) Filed: Oct. 31, 2007

(65) Prior Publication Data
US 2008/0273299 A1 Nov. 6, 2008

(30) Foreign Application Priority Data
May 4, 2007 (TW) .............................. 96115811 A

(51) Int. Cl.
*H01L 21/48* (2006.01)
(52) U.S. Cl. ...................................... 438/110
(58) Field of Classification Search ........................ None
See application file for complete search history.

(56) References Cited

U.S. PATENT DOCUMENTS

| | | | |
|---|---|---|---|
| 5,677,524 A | 10/1997 | Haghiri-Tehrani et al. | |
| 5,937,512 A * | 8/1999 | Lake et al. | 29/832 |
| 6,040,622 A | 3/2000 | Wallace | |
| 6,548,911 B2 | 4/2003 | Yu et al. | |
| 6,624,005 B1 * | 9/2003 | DiCaprio et al. | 438/113 |
| 7,235,423 B1 * | 6/2007 | Wang et al. | 438/107 |
| 7,378,301 B2 * | 5/2008 | Koh et al. | 438/126 |
| 2002/0186549 A1 * | 12/2002 | Bolken | 361/737 |
| 2004/0259291 A1 | 12/2004 | Takiar | |
| 2007/0117276 A1 * | 5/2007 | Chen et al. | 438/127 |
| 2007/0210444 A1 * | 9/2007 | Chang et al. | 257/704 |
| 2007/0270040 A1 * | 11/2007 | Jang et al. | 439/660 |

FOREIGN PATENT DOCUMENTS

| | | |
|---|---|---|
| JP | 62-239554 | 10/1987 |
| TW | 570294 | 3/1992 |

\* cited by examiner

*Primary Examiner*—Scott B Geyer
(74) *Attorney, Agent, or Firm*—Peter F. Corless; Steven M. Jensen; Edwards Angell Palmer & Dodge LLP

(57) ABSTRACT

A memory card and method for fabricating the same are disclosed, which includes mounting and electrically connecting at least a chip to a circuit board unit having a predefined shape of a memory card; attaching a thin film to the surface of the circuit board unit opposed to the surface with the chip mounted thereon; covering the circuit board unit and the thin film by a mold so as to form a mold cavity having same shape as the circuit board unit but bigger size; filling a packaging material in the mold cavity so as to form an encapsulant encapsulating the chip and outer sides of the circuit board unit, thus integrally forming a memory card having the predefined shape. The present invention eliminates the need to perform a shape cutting process by using water jet or laser as in the prior art, thus reducing the fabricating cost and improving the fabricating yield.

15 Claims, 3 Drawing Sheets

MEMORY CARD AND METHOD FOR FABRICATING THE SAME

BACKGROUND OF THE INVENTION

1. Field of the Invention

The present invention relates generally to a semiconductor packaging technique, and more particularly to a memory card and method for fabricating the same.

2. Description of Related Art

With the increasing development of digital products such as cameras, mobile phones, PDAs (Personal Digital Assistants), video and audio players, demands for flash memory cards are increasing. The flash memory cards are generally categorized into CF (Compact Flash) cards, SMCs (Smart Media Cards), MMCs (Multi Media Cards), SD (Secure Digital) cards, MS (Memory Stick) cards and so on. While the storage capacity of the memory cards keeps growing, structure of the memory cards is continuously improved so as to prevent easy breaking of the memory cards and meanwhile allow the memory cards to obtain a desired waterproof effect.

A conventional memory card generally comprises two sheets with a circuit board disposed therebetween. The two sheets are bonded together by using a high frequency welding technique, thereby forming a memory card structure. However, the memory card can easily break or be damaged from the bonding position or tiny spacing can appear at the bonding position after many times the memory card is inserted into and taken out from an electronic product over a long period of time. Techniques related to the memory card structure are disclosed by such as U.S. Pat. Nos. 5,677,524, 6,040,622, 6,624,005 and Japan Patent No. 62-239554.

Taiwan Patent No. 570294 discloses a method for fabricating a memory card, which comprises disposing and electrically connecting chips to a plurality of circuit board units of a circuit board; forming an encapsulant on the circuit board; cutting between the circuit board units by using a grinding wheel cutter so as to obtain a plurality of rectangle shaped packages in batch type; and embedding each package into a housing. However, the need of the housing and adhering the housing to the package increase cost and complicate the fabricating process, which cannot meet economic efficiency.

In addition, with development of much thinner, lighter, shorter and smaller electronic devices, memory cards are required to be further reduced in size, which has developed from MMC to RS-MMC (Reduced Size Multi Media Card) and MMC-Micro and developed from SD to mini SD and Micro-SD. Sony Corporation further develops Memory Stick Micro (M2). Corresponding to variation of fabricating processes and products, shape of memory cards is not any more limited to the conventional rectangular shape, but may be in any irregular shape. However, the above-described grinding wheel cutter can only form straight line cutting path and accordingly cannot meet demand of card type packages in irregular shape such as Micro-SD, MMC-Micro and M2.

U.S. Pat. No. 6,548,911 discloses a MMC fabricating technique eliminating the need of the housing. However, the technique can only be used to fabricate MMC type memory cards and cannot be used to fabricate memory cards of irregular shape such as MMC-Micro and Micro-SD.

US Patent Publication No. 2004/0259291 discloses a fabricating technique that can fabricate memory card packages in irregular shape and eliminate the need of the housing. The technique mainly comprises performing chip mounting and wire bonding processes corresponding to a plurality of circuit board units on a circuit board; forming an encapsulant on the circuit board; cutting the package by grinding, water jet or laser so as to form a plurality of card type packages in irregular shape such as Micro-SD, MMC-Micro and M2.

However, in the above-described fabricating process, the water jet used for cutting the packages of irregular shape involves making the water pass through ultra high pressure booster so as to increase water pressure to 55000 psi and then emitting the water from a nozzle having a diameter of 0.004 inch, thereby generating a high speed water stream of 3000 feet per second (about three times the sound speed). Meanwhile, fine sand of high rigidity can be added to increase the cutting ability for cutting metal or rigid material. But the water jet process needs high cost. Also, since an abrasive material of fine sand needs to be added to the water column of the water jet, the powder and the slag generated by the fine sand pollute the environment. Also, because the abrasive material must be discarded after one time use and cannot be recycled, the fabricating cost is relatively high. Further, as the cutting width and cutting path of the water jet are limited by pressure of the water jet and size of particles of the abrasive material, during cutting irregular packages, the cutting path can be unstable, which can adversely affect the fabricating yield. Further, the nozzle of the water jet may sometimes be blocked by the abrasive material, which relatively increases instability of the process. Moreover, as the cutting surface is often washed by the fine sand, it can become uneven.

Accordingly, a laser cut is tried to overcome the above drawbacks. However, the laser cut can lead to burning of the encapsulant and periphery of the circuit board, and result in an uneven cutting surface. Meanwhile, the laser cut can cause such problems as burr cuts and powder pollution. In addition, limited by the laser irradiation angle, part of the cutting surface of the package can become inclined. Also, the laser cutting cost (such as laser cutting equipment and lamp cost) is too high and cannot meet economic efficiency. Moreover, both the water jet and laser cutting can result in chip-out or cracking of the encapsulant when cutting from the upper side of encapsulant downward using fine sand or energized beam, thereby adversely affecting the shape and quality of the memory card packages.

Therefore, there is a need to provide a memory card and method for fabricating the same, which eliminates the need to perform a shape cutting process, has simplified fabricating process, shortened fabricating time, improved fabricating yield and low fabricating cost.

SUMMARY OF THE INVENTION

According to the above drawbacks, an objective of the present invention is to provide a memory card and method for fabricating the same without the need of a shape cutting process.

Another objective of the present invention is to provide a memory card and method for fabricating the same so as to simplify the fabricating process.

Another objective of the present invention is to provide a memory card and method for fabricating the same so as to shorten the fabricating time.

A further objective of the present invention is to provide a memory card and method for fabricating the same so as to improve the fabricating yield and reduce the fabricating cost.

In order to attain the above and other objectives, the present invention discloses a method for fabricating a memory card, which comprises: providing a circuit board with a plurality of spacing arranged circuit board units, wherein each of the circuit board units has a predefined shape of a memory card and is connected to the circuit board through a connecting portion, and at least a chip is mounted to and electrically connected with each of the circuit board units; attaching a thin film to a surface of the circuit board opposed to the surface mounted with the chips corresponding to the circuit board units; covering the circuit board and the thin film with a mold so as to define mold cavities having same shape as the circuit board units but bigger size, and filling a packaging material in the mold cavities so as to form an encapsulant encapsulating the chips and outer sides of the circuit board units; and removing the thin film and cutting away the connecting portions so as to obtain a plurality of memory cards having the predefined shape.

The present invention further provides a memory card, which comprises: a circuit board unit having a predefined shape of a memory card; at least a chip electrically connected to the circuit board unit; and an encapsulant formed by transfer molding and having same shape as the circuit board unit but bigger size, the encapsulant encapsulating the chip and outer sides of the circuit board unit.

The above-described fabricating method further comprises forming a chamfer at one side of each of the circuit board units so as to obtain memory card having the predefined shape and chamfer. The step of forming a chamfer is performed according to type of memory card and is not absolutely necessary. There is no special limitation on type and position of the chamfer. In one embodiment, the step of forming a chamfer can be performed after the encapsulant is formed. In another embodiment, the step of forming a chamfer can be performed before the thin film is removed and the connecting portions are cut away.

The predefined shape of memory card is an irregular shape, which can be a shape of Micro-SD, MMC-Micro or Memory Stick Micro (M2), that is, the memory card can be a card type package selected from the group consisting of Micro-SD, MMC-Micro and Memory Stick Micro (M2). The above-described circuit board can have a plurality of openings for separating the circuit board units. The shape of the openings corresponds to the shape of the circuit board unit and there is no special limitation on that. The chip can be electrically connected to the circuit board unit by flip chip, wire bonding and so on. The thin film can be made of a heat resistant material.

In one embodiment, the plurality of circuit board units of the circuit board is arranged in a single row, each of the circuit board units is connected to the circuit board through a connecting portion and the circuit board units are spaced from each other by openings. In another embodiment, the plurality of circuit board units of the circuit board is arranged in a plurality of rows, the circuit board units in a same row are spaced from each other by openings and the circuit board units in different rows are connected through connecting portions. Preferably, the connecting portions are connecting bars.

Each of the circuit board units can have a first surface to be mounted with the chip, a second surface opposed to the first surface, and conductive through holes penetrating the first and second surfaces. In addition, the first surface of the circuit board unit has circuit pattern to be electrically connected with the chip, the circuit pattern connecting the conductive through holes; the second surface of the circuit board unit has electrical terminals to be electrically connected with an external device, the electrical terminals respectively connecting the conductive through holes.

The mold comprises a lower mold abutting against the thin film and an upper mold covering the circuit board and the thin film, by defining the mold cavities through the upper mold and the thin film, space for filling of the packaging material is limited, thereby preventing leakage of the packaging material Therefore, according to the memory card and method for fabricating the same of the present invention, only by cutting away the connecting portions, the circuit board units can be separated from each other so as to obtain memory cards of card type packages of irregular shape such as Micro-SD, MMC-Micro or Memory Stick Micro (M2). Compared with the prior art that needs to cut encapsulant along an irregular cutting path around each circuit board unit, the present invention eliminates the need to perform a shape cutting process by using such as a grinding tool, water jet or laser, thereby simplifying the fabricating process and shortening the fabricating time. By avoiding the use of the tools such as a grinding tool, water jet or laser as in the prior art, the present invention reduces the equipment cost, improves the fabricating yield and reduces the fabricating cost. Meanwhile, the present invention avoids chip-out or cracking of the encapsulant caused by use of water jet or laser as in the prior art. Thus, the memory card and method for fabricating the same according to the present invention overcome the drawbacks of the prior art.

BRIEF DESCRIPTION OF DRAWINGS

FIGS. 1 to 4 are diagrams showing a method for fabricating a memory card according to the present invention, wherein FIG. 1 is an upper view of a circuit board, FIG. 2 is a sectional view along A-A sectional line of FIG. 1 with a thin film attached to the structure, FIG. 3 is a diagram showing a transfer molding process, FIG. 4 is a diagram showing a cutting process after the transfer molding is finished; and FIGS. 5A and 5B are structural diagrams of a memory card according to the present invention, wherein FIG. 5A is a side sectional diagram of the memory card and FIG. 5B is a bottom view of the memory card.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

FIGS. 1 to 5B are diagrams showing a memory card and a method for fabricating the same according to the present invention.

Figure 1:
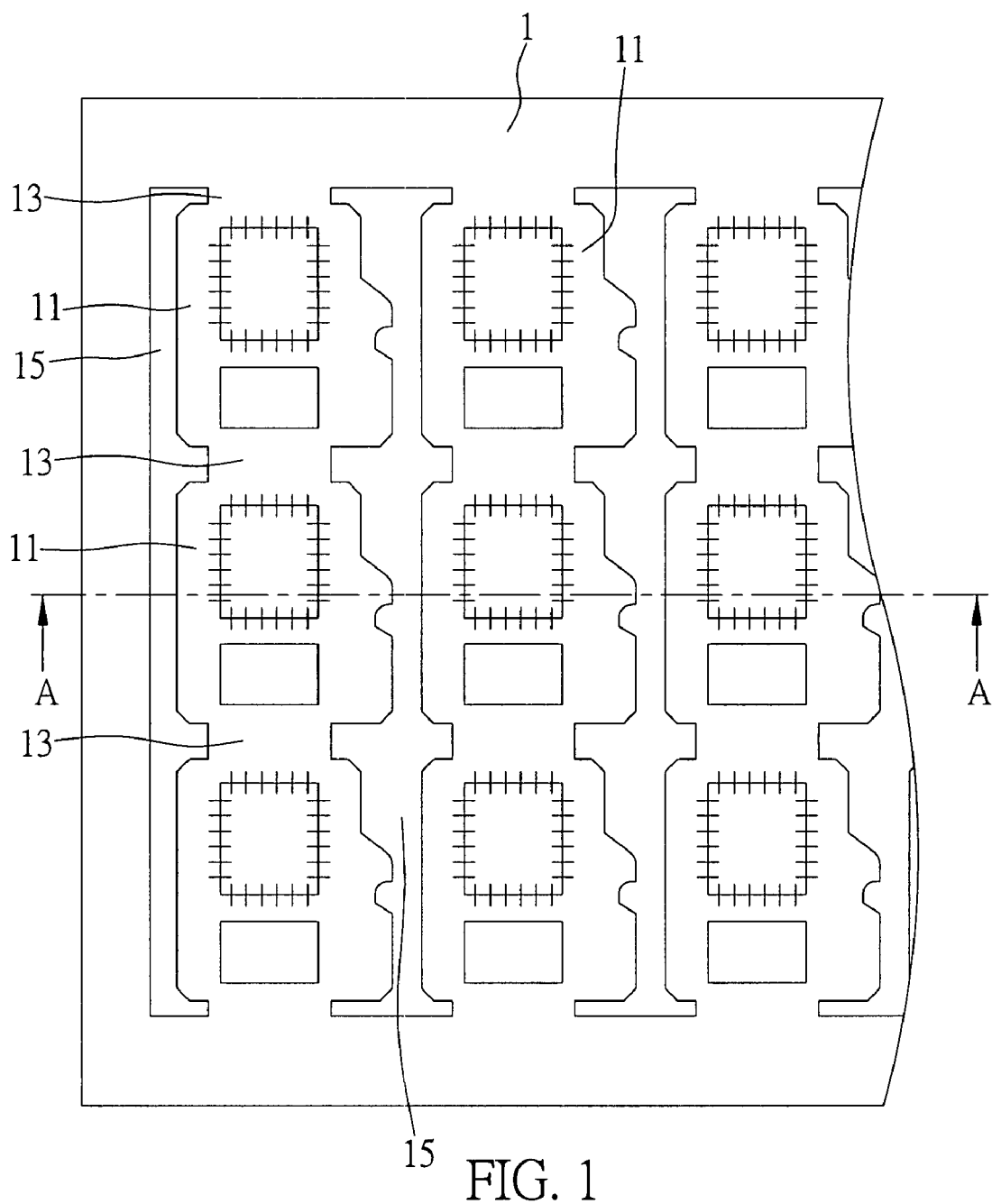

As shown in FIG. 1, a circuit board 1 is provided, which comprises a plurality of spacing arranged circuit board units 11. Each circuit board unit 11 has a predefined shape of a memory card and is connected to the circuit board 1 through a connecting portion 13. At least a chip 2 is disposed on and electrically connected to each of the circuit board units 11.

In the present embodiment, the circuit board units 11 have shape of a card type semiconductor package such as Micro-SD, MMC-Micro or Memory Stick Micro (M2), but size of the circuit board unit 11 is slightly smaller than that of the card type semiconductor package. Each of the circuit board units 11 has finished circuit layout and a plurality of electrical terminals (not shown) is disposed on the back side of the circuit board unit 11 for electrically connecting with an external device. The above-described connecting portion 13 can be a connecting bar.

Meanwhile, the plurality of circuit board units 11 of the circuit board 1 of the present embodiment can be arranged in plurality of rows, that is, the circuit board units 11 are arranged in an array structure, wherein the circuit board units 11 in a same row are spaced from each other by openings 15 and the circuit board units 11 in different rows are connected with each other by the connecting portions 13. In other embodiments, the circuit board units 11 can alternatively be arranged in a single row or be arranged in different number of rows according to various batch type fabrication requirement, which is not limited to the present embodiment. For example, the plurality of circuit board units 11 of the circuit board 1 can be arranged in a single row, each of the circuit board units 11 is connected to the circuit board 1 through a connecting portion 13 and the circuit board units 11 are spaced from each other by openings 15. Since such variation in the number is well known by those skilled in the field of circuit boards or substrates detailed description thereof is omitted here.

Each of the circuit board units 11 can have a first surface to be mounted with the chip 2, a second surface opposed to the first surface, and conductive through holes (not shown) penetrating the first and second surfaces. The first surface of the circuit board unit 11 has circuit pattern (not shown) to be electrically connected with the chip 2, the circuit pattern connecting the conductive through holes; the second surface of the circuit board unit 11 has electrical terminals (not shown) to be electrically connected with an external device, the electrical terminals respectively connecting the conductive through holes. In the present embodiment, the chip 2 is electrically connected to the circuit board unit 11 by wire bonding and electrically connected to the electrical terminals at the back side of the circuit board unit 11 through the conductive through holes. Alternatively, the chip 2 can be electrically connected to the circuit board unit 11 by flip chip or other suitable method, and the number and position of the chip 2 are not limited to the present embodiment. Further, passive components to cooperate with the chip 2, if needed, can be coupled to the circuit board unit 11.

Figure 2:
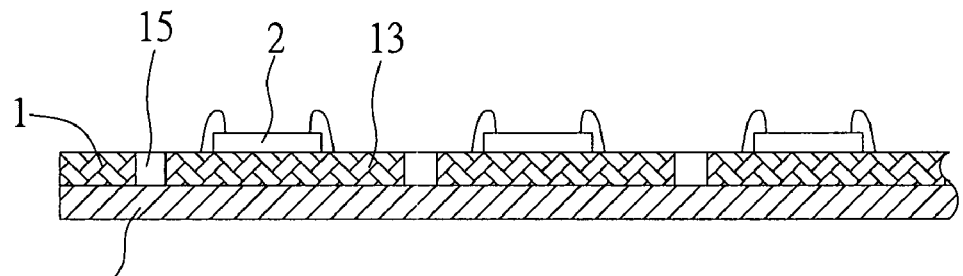

As shown in FIG. 2, a thin film 3 is attached to a surface of the circuit board 1 opposed to the surface mounted with the chips 2 corresponding to the circuit board units 11, that is, the thin film 3 is attached to the bottom surface of the circuit board 1, thereby sealing the bottom of the openings 15 and protecting the electrical contacts on the second surface (that is, the bottom surface) of the circuit board units 11. The thin film 3 can be made of a heat resistant material and have flexible elastic deformation characteristic.

Figure 3:
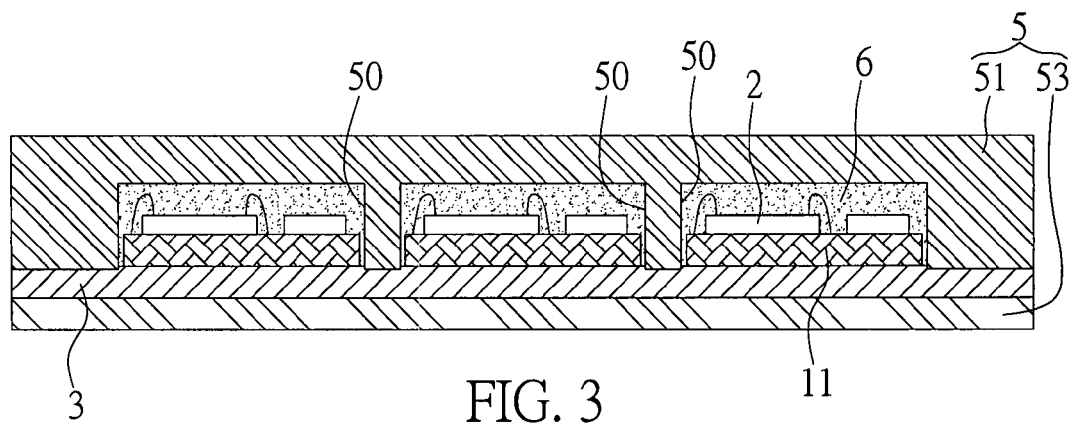

As shown in FIG. 3, a mold 5 is used to cover the circuit board 1 and the thin film 3, which defines mold cavities 50 having same shape as the circuit board unit 11 but bigger size. A packaging material is filled in the mold cavities 50 so as to form an encapsulant 6 encapsulating the chips 2 and outer sides of the circuit board units 11. Since the mold cavities 50 have same shape as the circuit board units 11 but bigger size, the encapsulant 6 formed by transfer molding of the packaging material has the predefined shape of memory card.

In the present embodiment, the above-described mold 5 comprises a lower mold 53 abutting against the thin film 3 and an upper mold 51 covering the circuit board 1 and the thin film 3, wherein the upper mold 51 and the thin film 3 defines mold cavities 50 for limiting space for filling of the packaging material. As the thin film 3 seals the bottom of the openings 15 (not shown) and protects the electrical contacts on the second surface (the bottom surface) of the circuit board units 11 and elastic deformation characteristic of the thin film 3 facilitates close junction between the upper mold 51 and the lower mold 53, leakage of the packaging material is prevented.

Figure 4:
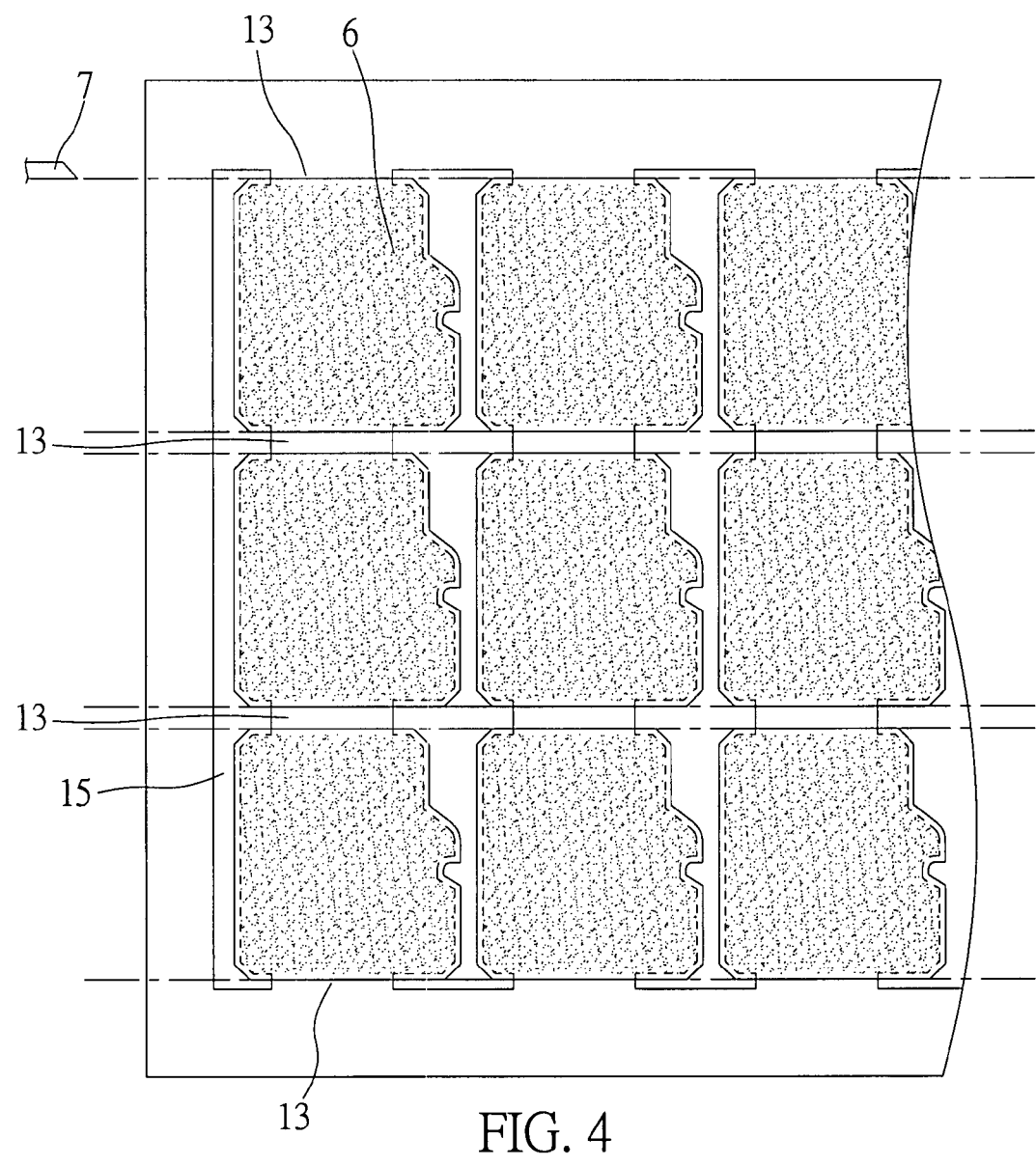
Figure 5A:
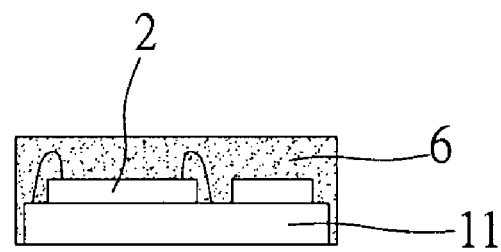
Figure 5B:
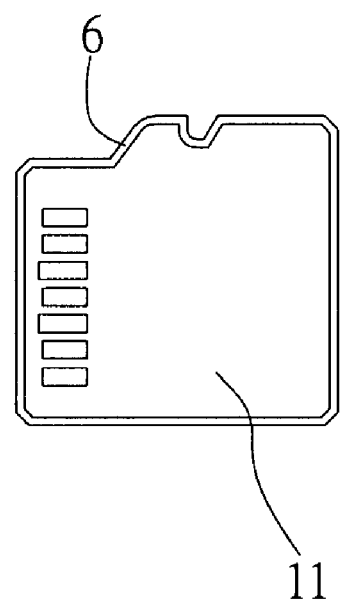

Finally, the thin film 3 is removed and the connecting portions 13 are cut away so as to obtain a plurality of memory cards having the predefined shape. As shown in FIG. 4, after the encapsulant 6 is formed on the circuit board units 11 by transfer molding of the package material, a plurality of card type packages is obtained, except the connecting portions 13 are still connected to the circuit board 3. Since the circuit board units 11 in a same row are spaced from each other by the openings 15, longitudinal cutting is not required. Instead, it only needs to horizontally cut along the dash lines by using a cutting tool 7 such as a saw blade or a cutter so as to cut away the connecting portions 13, thus obtaining memory cards having the predefined shape as shown in FIGS. 5A and 5B. Of course, the step of removing the thin film 3 and cutting away the connecting portions 13 can be performed according to the process requirement, for example, removing the thin film 3 can be performed before or after the connecting portions 13 are cut away.

Compared with the prior art that needs to cut the encapsulant along an irregular cutting path around the circuit board units, the present invention only needs to cut away the connecting portions 13 for separating the circuit board units 11 from each other so as to obtain memory cards of card type packages having irregular shape such as Micro-SD, MMC-Micro or Memory Stick Micro (M2). Accordingly, the present invention eliminates the need to perform a shape cutting process by using a grinding tool, water jet or laser, which thus simplifies the fabrication process and shortens the fabrication time. Meanwhile, by avoiding the use of the tools such as a grinding tool, water jet or laser as in the prior art, the present invention reduces the equipment cost, improves the fabricating yield and reduces the fabricating cost. Also, the present invention avoids chip-out or cracking of the encapsulant caused by use of water jet or laser as in the prior art.

It should be noted that corresponding to the shape design of card type packages such as Micro-SD, MMC-Micro and Memory Stick Micro (M2), the above-described method for fabricating a memory card further comprises forming a chamfer at one side of each of the circuit board units 11 so as to form memory cards having the predefined shape and chamfer. Of course, the step of forming a chamfer is performed according to type of memory cards and is not absolutely necessary. Also, there is no special limitation on type and position of the chamfer. Meanwhile, the step of forming a chamfer can be performed after the encapsulant 6 is formed or performed before the thin film 3 is removed and the connecting portions 13 are cut away.

A memory card fabricated through the above-described method is shown in FIGS. 5A and 5B The memory card comprises a circuit board unit 11 having a predefined shape of a memory card; at least a chip 2 electrically connected to the circuit board unit 11; and an encapsulant 6 encapsulating the chip 2 and outer sides of the circuit board unit 11, wherein the encapsulant 6 is formed by transfer molding and has same shape as the circuit board unit 11 but bigger size.

The circuit board unit 11 can have a first surface to be mounted with the chip 2, a second surface opposed to the first surface, and conductive through holes (not shown) penetrating the first and second surfaces. In addition, the first surface of the circuit board unit 11 has circuit pattern (not shown) to be electrically connected with the chip 2, the circuit pattern connecting the conductive through holes; and the second surface of the circuit board unit 11 has electrical terminals (not shown) to be electrically connected with an external device, the electrical terminals respectively connecting the conductive through holes. The above-described encapsulant 6 encapsulates the chip 2, the outer sides and the first surface of the circuit board unit 11, but does not encapsulate the second surface of the circuit board unit 11.

In the present embodiment, the chip 2 is electrically connected to the circuit board unit 11 by wire bonding and electrically connected to the electrical terminals at the back side of the circuit board unit 11 through the conductive through holes. Alternatively, the chip 2 can be electrically connected to the circuit board unit 11 by flip chip or other suitable method. The number and position of the chip 2 are not limited to the present embodiment. In addition, passive components to cooperate with the chip 2, if needed, can be coupled to the circuit board unit 11.

Therefore, according to the memory card and method for fabricating the same of the present invention, only by cutting away the connecting portions 13, the circuit board units 11 can be separated from each other so as to obtain memory cards of card type packages of irregular shape such as Micro-SD, MMC-Micro or Memory Stick Micro (M2). Compared with the prior art that needs to cut encapsulant along an irregular cutting path around each circuit board unit, the present invention eliminates the need to perform a shape cutting process by using such as a grinding tool, water jet or laser, thereby simplifying the fabricating process and shortening the fabricating time. Also, by avoiding the use of the tools such as a grinding tool, water jet or laser as in the prior art, the present invention reduces the equipment cost, improves the fabricating yield and reduces the fabricating cost. Meanwhile, the present invention avoids chip-out or cracking of the encapsulant caused by use of water jet or laser as in the prior art. Thus, the memory card and method for fabricating the same according to the present invention overcome the drawbacks of the prior art.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A method for fabricating a memory card, comprising:
providing a circuit board with a plurality of spacing arranged circuit board units, wherein each of the circuit board units has a predefined shape of a memory card and is connected to the circuit board through a connecting portion, and at least a chip is mounted to and electrically connected with each of the circuit board units;
attaching a thin film to a surface of the circuit board opposed to the surface mounted with the chips corresponding to the circuit board units;
covering the circuit board and the thin film with a mold so as to define mold cavities having same shape as the circuit board units but bigger size, and filling a packaging material in the mold cavities so as to form an encapsulant encapsulating the chips and outer sides of the circuit board units; and
removing the thin film and cutting away the connecting portions so as to obtain a plurality of memory cards having the predefined shape.

2. The method of claim 1, wherein the chip is electrically connected to the circuit board unit by one of the methods consisting of flip chip and wire bonding.

3. The method of claim 1, wherein the circuit board has a plurality of openings for separating the circuit board units.

4. The method of claim 1, wherein each of the circuit board units has a first surface to be mounted with the chip, a second surface opposed to the first surface, and conductive through holes penetrating the first and second surfaces.

5. The method of claim 4, wherein the first surface of the circuit board unit has circuit pattern connecting the conductive through holes, and the second surface of the circuit board unit has electrical terminals respectively connecting the conductive through holes.

6. The method of claim 1, wherein the thin film is made of a heat resistant material.

7. The method of claim 1, wherein the mold comprises a lower mold abutting against the thin film and an upper mold covering the circuit board and the thin film, by defining the mold cavities through the upper mold and the thin film, space for filling of the packaging material is limited, thereby preventing leakage of the packaging material.

8. The method of claim 1, wherein the predefined shape of the memory card is an irregular shape.

9. The method of claim 1, wherein the connecting portion is a connecting bar.

10. The method of claim 1, wherein the plurality of circuit board units of the circuit board is arranged in a single row, each of the circuit board units is connected to the circuit board through a connecting portion and the circuit board units are spaced from each other by openings.

11. The method of claim 1, wherein the plurality of circuit board units of the circuit board is arranged in a plurality of rows, the circuit board units in a same row are spaced from each other by openings, and the circuit board units in different rows are connected with each other through connecting portions.

12. The method of claim 1, further comprising forming a chamfer at one side of each of the circuit board units so as to obtain memory card having the predefined shape and chamfer.

13. The method of claim 12, wherein the step of forming the chamfer is performed after the encapsulant is formed.

14. The method of claim 12, wherein the step of forming the chamfer is performed before the thin film is removed and the connecting portions are cut away.

15. The method of claim 1, wherein the memory card is a card type package selected from the group consisting of Micro-SD, MMC-Micro and Memory Stick Micro (M2).

* * * * *